| (12) | United States Patent<br>Kim et al. | (10) Patent No.: US 12,404,579 B2<br>(45) Date of Patent: Sep. 2, 2025 |

(54) DEPOSITION APPARATUS AND DEPOSITION METHOD

(71) Applicant: Samsung Display Co., LTD., Yongin-si (KR)

(72) Inventors: Jae Sik Kim, Yongin-si (KR); Woo Yong Sung, Yongin-si (KR); Seung Ho Yoon, Yongin-si (KR); Hyoung Sub Lee, Yongin-si (KR); Hye Min Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/511,964

(22) Filed: Nov. 16, 2023

(65) Prior Publication Data

US 2024/0263295 A1 Aug. 8, 2024

(30) Foreign Application Priority Data

Feb. 7, 2023 (KR) .................. 10-2023-0016196

(51) Int. Cl.
| | |
|---|---|
| *C23C 14/24* | (2006.01) |
| *B41J 2/145* | (2006.01) |
| *B41J 3/407* | (2006.01) |
| *B41M 5/00* | (2006.01) |
| *C23C 14/12* | (2006.01) |

(52) U.S. Cl.
CPC .............. *C23C 14/24* (2013.01); *B41J 2/145* (2013.01); *B41J 3/407* (2013.01); *B41M 5/0047* (2013.01); *C23C 14/12* (2013.01)

(58) Field of Classification Search
CPC ....... C23C 14/24; C23C 14/12; C23C 14/243; C23C 14/505; B41J 2/145; B41J 3/407; B41J 2/1606; B41J 2/1609; B41J 2/1634; B41J 2/13; B41M 5/0047; H10K 71/10; H10K 71/135
See application file for complete search history.

(56) References Cited

U.S. PATENT DOCUMENTS 8,777,365 B2 * 7/2014 Noguera .................. B41J 2/125
347/19

FOREIGN PATENT DOCUMENTS

| KR | 100813516 | 3/2008 |
| KR | 1020130045432 | 5/2013 |
| KR | 1020140019579 | 2/2014 |
| KR | 1020210052725 A | 5/2021 |
| KR | 1020220003795 | 1/2022 |

* cited by examiner

*Primary Examiner* — Bradley W Thies
(74) *Attorney, Agent, or Firm* — CANTOR COLBURN LLP

(57) ABSTRACT

A deposition apparatus includes: a chamber; a deposition source disposed in the chamber; a rotating plate disposed in the chamber, where an inkjet head is fixed to the rotating plate to allow a nozzle plate of the inkjet head to be vertically aligned with the deposition source; and a first driving unit disposed in the chamber, where the first driving unit rotates the rotating plate about a vertical axis.

9 Claims, 11 Drawing Sheets

DEPOSITION APPARATUS AND DEPOSITION METHOD

This application claims priority to Korean Patent Application No. 10-2023-0016196, filed on Feb. 7, 2023, and all the benefits accruing therefrom under 35 U.S.C. § 119, the content of which in its entirety is herein incorporated by reference.

BACKGROUND

(a) Field

The present disclosure relates to a deposition apparatus and a deposition method.

(b) Description of the Related Art

An inkjet printing device may be used in a manufacturing process of an electronic device. For example, in manufacturing a display device such as an emissive display device or a liquid crystal display, patterned layers such as a color filter layer, a color conversion layer, and an emission layer may be formed using an inkjet printing device.

The inkjet printing device may include an inkjet head including a nozzle plate in which nozzles are arranged. A predetermined pattern may be printed on a substrate by discharging ink through the nozzles while moving the inkjet head.

SUMMARY

A functional coating layer such as a liquid repellent layer may be disposed on a surface of a nozzle plate of an inkjet head. The functional coating layer may be damaged when cleaning or wiping the surface of the nozzle plate for maintenance of the inkjet head, for example. In addition, it may be desirable to coat an inside of the inkjet head and the surface of the nozzle plate with different materials, respectively.

Embodiments relate to a deposition apparatus and a deposition method, capable of selectively forming a highly durable functional coating layer on a surface of a nozzle plate.

An embodiment of the present disclosure provides a deposition apparatus including: a chamber; a deposition source disposed in the chamber; a rotating plate disposed in the chamber, where an inkjet head is fixed to the rotating plate to allow a nozzle plate of the inkjet head to be vertically aligned with the deposition source; and a first driving unit disposed inn the chamber, where the first driving unit rotates the rotating plate about a vertical axis.

In an embodiment, the deposition apparatus may further include a second driving unit which rotates the inkjet head about a horizontal axis.

In an embodiment, the second driving unit may be fixed to the rotating plate.

In an embodiment, a distance between the nozzle plate and the deposition source in a vertical direction may be 1 m±8 cm, and an inclined angle of the nozzle plate with respect to the vertical direction may be ±10°.

In an embodiment, a distance between the nozzle plate and the deposition source in a vertical direction may be greater than a mean free path of a deposition material evaporated from the deposition source.

In an embodiment, the deposition material may be a self-assembled monolayer (SAM) material having a molecular weight in a range of 1,000 to 10,000.

In an embodiment, the deposition source may be provided in plural, and a distance between two adjacent deposition sources in a horizontal direction may be less than or equal to a length of the nozzle plate.

In an embodiment, the inkjet head may be fixed to the rotating plate in a state where a portion thereof except for the nozzle plate is sealed.

In an embodiment, a plurality of inkjet heads may be radially fixed with respect to a center of the rotating plate.

An embodiment of the present disclosure provides a deposition method including: positioning a deposition source in a chamber; fixing an inkjet head to a rotating plate in the chamber to allow a nozzle plate of the inkjet head to be vertically aligned with the deposition source; and rotating the inkjet head about a vertical axis by rotating the rotating plate.

In an embodiment, the deposition method may further include rotating the inkjet head about a horizontal axis.

In an embodiment, the rotating the inkjet head about the vertical axis and the rotating the inkjet head about the horizontal axis may be simultaneously performed.

In an embodiment, a distance between the nozzle plate and the deposition source in a vertical direction may be 1 m±8 cm, and an inclined angle of the nozzle plate with respect to the vertical direction may be ±10°.

In an embodiment, a distance between the nozzle plate and the deposition source in a vertical direction may be greater than a mean free path of a deposition material evaporated from the deposition source.

In an embodiment, the deposition material may be a SAM material having a molecular weight in a range of 1,000 to 10,000.

In an embodiment, the deposition source may be provided in plural, and a distance between two adjacent deposition sources in a horizontal direction may be less than or equal to a length of the nozzle plate.

In an embodiment, the inkjet head may be fixed to the rotating plate in a state where a portion thereof except for the nozzle plate is sealed.

In an embodiment, the fixing the inkjet head to the rotating plate in the chamber may include fixing a plurality of inkjet heads radially with respect to a center of the rotating plate.

According to embodiments, it is possible to provide a deposition apparatus and a deposition method, capable of selectively forming a highly durable functional coating layer on a surface of a nozzle plate.

DETAILED DESCRIPTION

Figure 1:
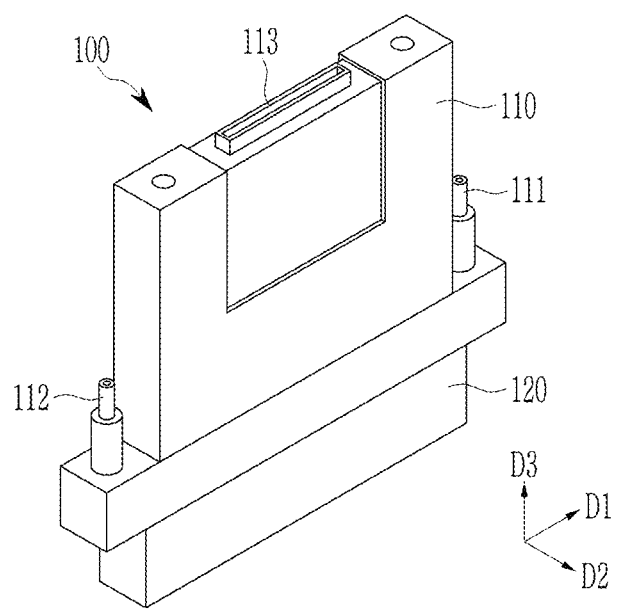
FIG. 1 schematically illustrates an inkjet head according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In addition, in the specification, "connected" means that two or more components are not only directly connected, but two or more components may be connected indirectly through other components, physically connected as well as being electrically connected, or it may be referred to be different names depending on the location or function, but may include connecting each of parts that are substantially integral to each other.

In the drawings, signs "D1", "D2", and "D3" are used to indicate directions, wherein D1 is used for indicating a first direction, D2 is used for indicating a second direction that is perpendicular to the first direction, and D3 is used for indicating a third direction that is perpendicular to the first direction and the second direction.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
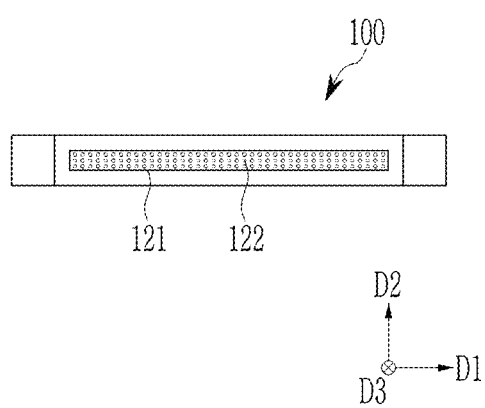
FIG. 2 illustrates a bottom view showing a nozzle portion in the inkjet head shown in FIG. 1.
Figure 3:
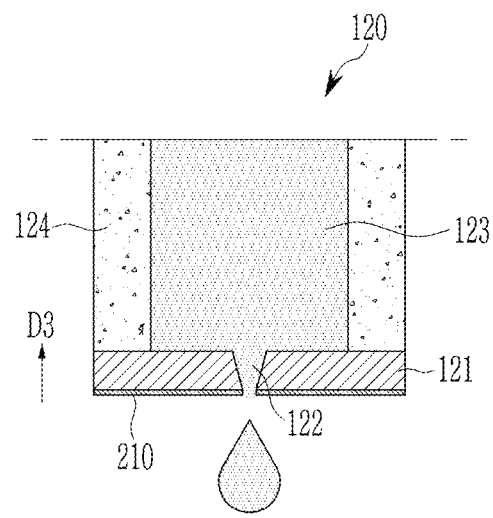
FIG. 3 schematically illustrates a cross-section of the vicinity of a nozzle portion according to an embodiment.
Figure 4:
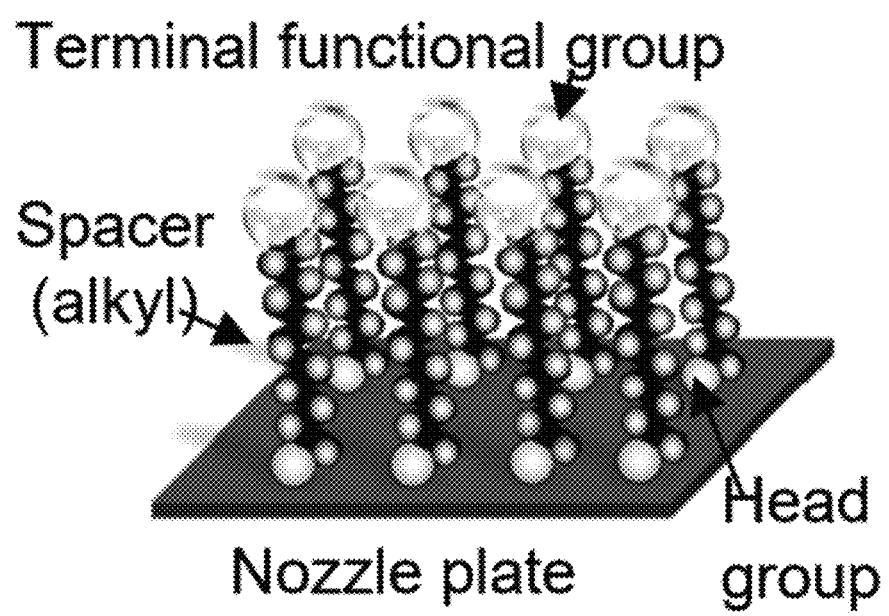
FIG. 4 illustrates a structure of a self-assembled monolayer (SAM) coating layer.

FIG. 1 schematically illustrates an inkjet head according to an embodiment, FIG. 2 illustrates a bottom view showing a nozzle portion in the inkjet head shown in FIG. 1, and FIG. 3 schematically illustrates a cross-section of the vicinity of a nozzle portion according to an embodiment. FIG. 4 illustrates a structure of a self-assembled monolayer (SAM) coating layer.

Referring to FIG. 1 and FIG. 2, in an embodiment, the inkjet head 100 may include a main body 110 and a nozzle portion 120.

The main body 110 may serve as a frame for the Inkjet head 100. The main body 110 may include a chamber that receives ink that will drip onto an object to be printed (e.g., a substrate). The main body 110 may include an ink inlet 111 capable of injecting (or configured to inject) ink into the chamber and may include an ink outlet 112 capable of discharging (or configured to discharge) ink from the chamber. The main body 110 may include an input/terminal portion 113 capable of receiving (or configured to receive) signals from a controller of an inkjet printing apparatus. The main body 110 may include a driver (e.g., an application specific integrated circuit (ASIC)) that controls ink ejection based on a signal inputted to the input/output terminal portion 113. In an embodiment, for example, the driver may apply a voltage to an electrode of a piezoelectric element. Although FIGS. 1 to 3 illustrate an embodiment where the main body 110 has a substantially quadrangular column shape, the shape of the main body 110 may be variously modified.

The nozzle portion 120 may be disposed at a lower portion of the main body 110. In an embodiment, as shown in FIG. 2, the nozzle portion 120 may include a nozzle plate 121 and nozzles 122. The nozzles 122 may be provided in the form of orifices in the nozzle plate 121. The nozzle plate 121 may include or be formed of a material such as a polymer (e.g., polyimide), semiconductor (e.g., silicon wafer), or a metal. The nozzles 122 may be formed by laser processing the nozzle plate 121 (e.g., laser ablation). The nozzle portion 120 may include a piezoelectric element or a heater capable of pushing ink through the nozzles 122.

The inkjet head 100 may be mounted on an inkjet printing device to be movable in a first direction D1, a second direction D2, and/or a third direction D3 on an object.

Referring to FIG. 2, when the inkjet head 100 is viewed from a bottom surface or in a plan view (e.g., a bottom plan view), the inkjet head 100 and the nozzle portion 120 may have a rod shape extending in a direction. The nozzle plate 121 may have a substantially quadrangular planar shape. The nozzle plate 121 may have a length in the direction in which the nozzle portion 120 extends and a width in a direction crossing a length (extension) direction. The nozzles 122 defined or formed on the nozzle plate 121 may be disposed along the length (extension) direction of the inkjet head 100. Intervals between the nozzles 122 may be constant, but not being limited thereto. The nozzles 122 may be disposed in one row or two or more rows. In an embodiment, the nozzles 122 may be disposed in three rows. Each of the nozzles 122 may eject ink in a direction perpendicular or almost perpendicular to an object, or may eject ink in an oblique direction. The number, spacing, and size of the nozzles 122 may be variously changed or modified, and printing resolution may vary depending on the number, spacing, and/or size of the nozzles 122.

Referring to FIG. 3, cross-sections of the nozzle plate 121 in which the nozzles 122 are defined or formed and a periphery thereof in the nozzle portion 120 are illustrated. A channel 123 for accommodating ink may be defined or formed above the nozzle plate 121, and a piezoelectric element 124 may be disposed around the channel 123. A lower portion of the channel 123 may be closed by the nozzle plate 121. and may be connected to the nozzles 122. An inside of the channel 123 and insides of the nozzles 122 may form a flow path.

When ink is ejected through the nozzles 122, the ink may not be ejected vertically but may be ejected in an oblique direction in a case where the ink contacts a surface of the nozzle plate 121 (i.e., surface exposed to the outside). In this case, since accuracy of impact may decrease, the surface of the nozzle plate 121 may be coated with a liquid repellent layer 210. Typically, the liquid repellent layer 210 may be formed by high-temperature fusing of liquid polytetrafluoroethylene (PTFE) or perfluoroalkoxy (PFA). However, since the liquid repellent layer including or formed of, e.g., PTFE or PFA have low hardness (e.g., pencil strength 1B to 2B), durability may not be sufficient when applied to the surface of the nozzle plate 121 exposed to the outside. For example, when cleaning or wiping the surface of the nozzle plate 121 with ethanol or the like for maintenance of the inkjet head 100, the liquid repellent layer having low hardness may be damaged. In an embodiment, the liquid repellent layer 210 may be (defined by) a self-assembled monolayer (SAM) having high hardness to improve durability thereof. In an embodiment, although not illustrated, a functional layer (e.g., a SiOC layer) for improving adhesion of the liquid repellent layer 210 may be disposed between a surface of the nozzle plate 121 and the liquid repellent layer 210.

Referring to FIG. 4, a terminal functional group may be exposed on a surface due to a well-ordered structural characteristic of the SAM, and a surface characteristic may be controlled at a molecular level by using this functional group. For example, a terminal functional group of the SAM may be —H, —CH, —CH$_2$, —CH$_3$, —F, —CF, —CF$_2$, —CF$_3$, etc., and may include, e.g., a trifluoromethyl group. A spacer of the SAM may include a hydrocarbon chain. For example, the spacer may include an alkyl having 8 to 50 carbon atoms. The spacer may include a structure containing one or more oxygens (e.g., ether). Ahead group may be —OCH$_3$, —Cl, —H, or the like containing Si. The head group may be chemisorbed on a surface of the nozzle plate 121. The liquid repellent layer 210 including the SAM may have a contact angle in a range of about 100° to about 200° or in a range of about 100° to about 150° of deionized water. Surface energy of the liquid repellent layer 210 may be 20 mN/m or less. The liquid repellent layer 210 may have a friction coefficient of 0.03 or less. The liquid repellent layer 210 may have a pencil hardness of 1 H to 9 H. The liquid repellent layer 210 may have better liquid-repellent performance, slip performance, and anti-scratch performance than those of a conventional liquid repellent layer.

The liquid repellent layer 210 including such a SAM may be formed by coating the surface of the nozzle plate 121 with the SAM. In this case, since the nozzles 122 are formed in the nozzle plate 121, an unwanted SAM may also be disposed on inner surfaces of the nozzles 122 (in particular, on an inner surface close to the surface of the nozzle plate 121) during SAM coating. That is, the nozzles 122 extending through the nozzle plate 121 are formed in the nozzle plate 121, and thus it may be difficult to selectively form the SAM only on the surface of the nozzle plate 121. If the SAM is disposed on the inner surfaces of the nozzles 122, the inner surfaces of the nozzles 122 have liquid repellency, and thus it may be difficult to control ink ejection. In addition, it is desired to further lower the meniscus pressure to prevent ink from flowing out through the nozzles 122. Before forming the nozzles 122 on the nozzle plate 121, the nozzles 122 may be formed after coating the SAM, to prevent the SAM from being formed on the inner surfaces of the nozzles 122. However, during laser processing (e.g., laser ablation) to form the nozzles 122, the liquid repellent layer 210 around the nozzles 122 may be damaged.

Figure 5:
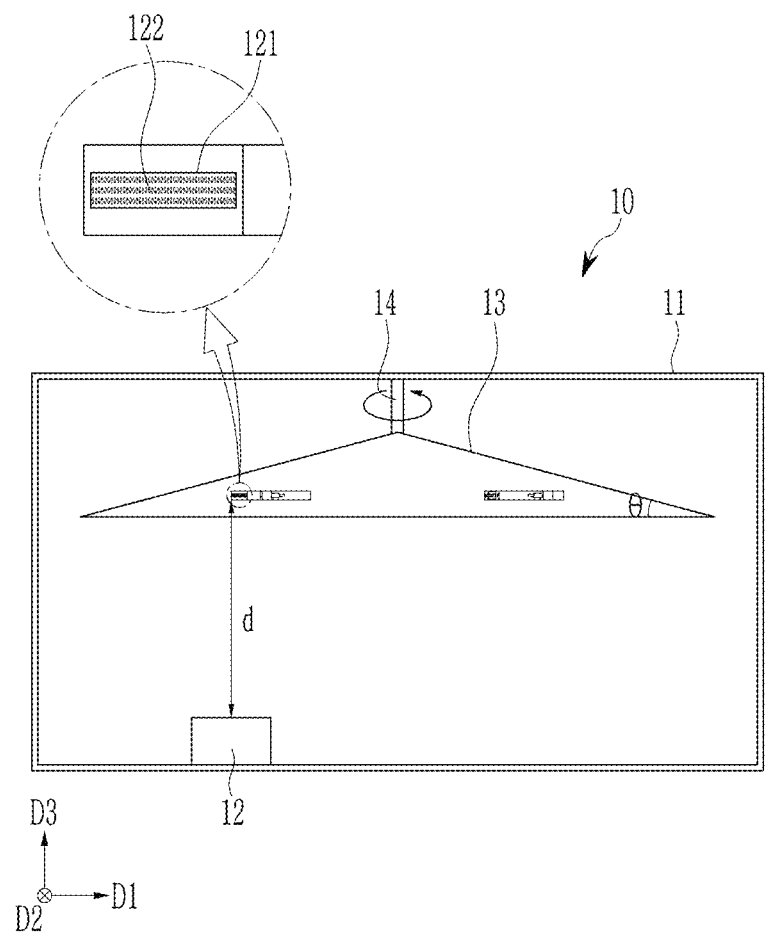
FIG. 5 and FIG. 6 schematically illustrate a deposition apparatus and a deposition method according to an embodiment.
Figure 6:
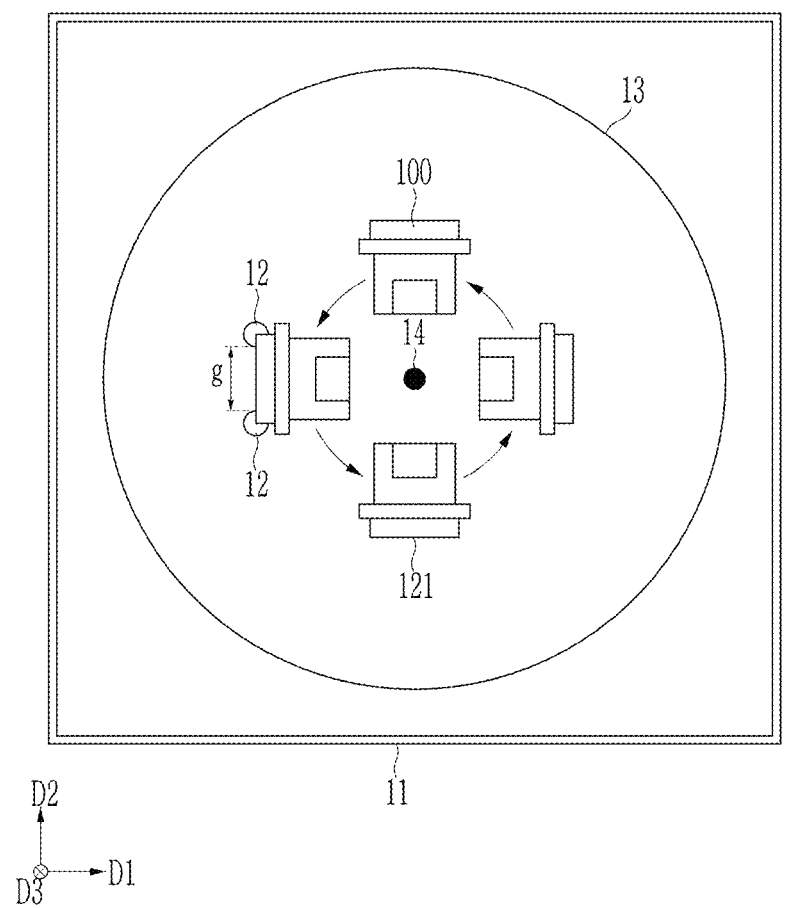
Figure 7:
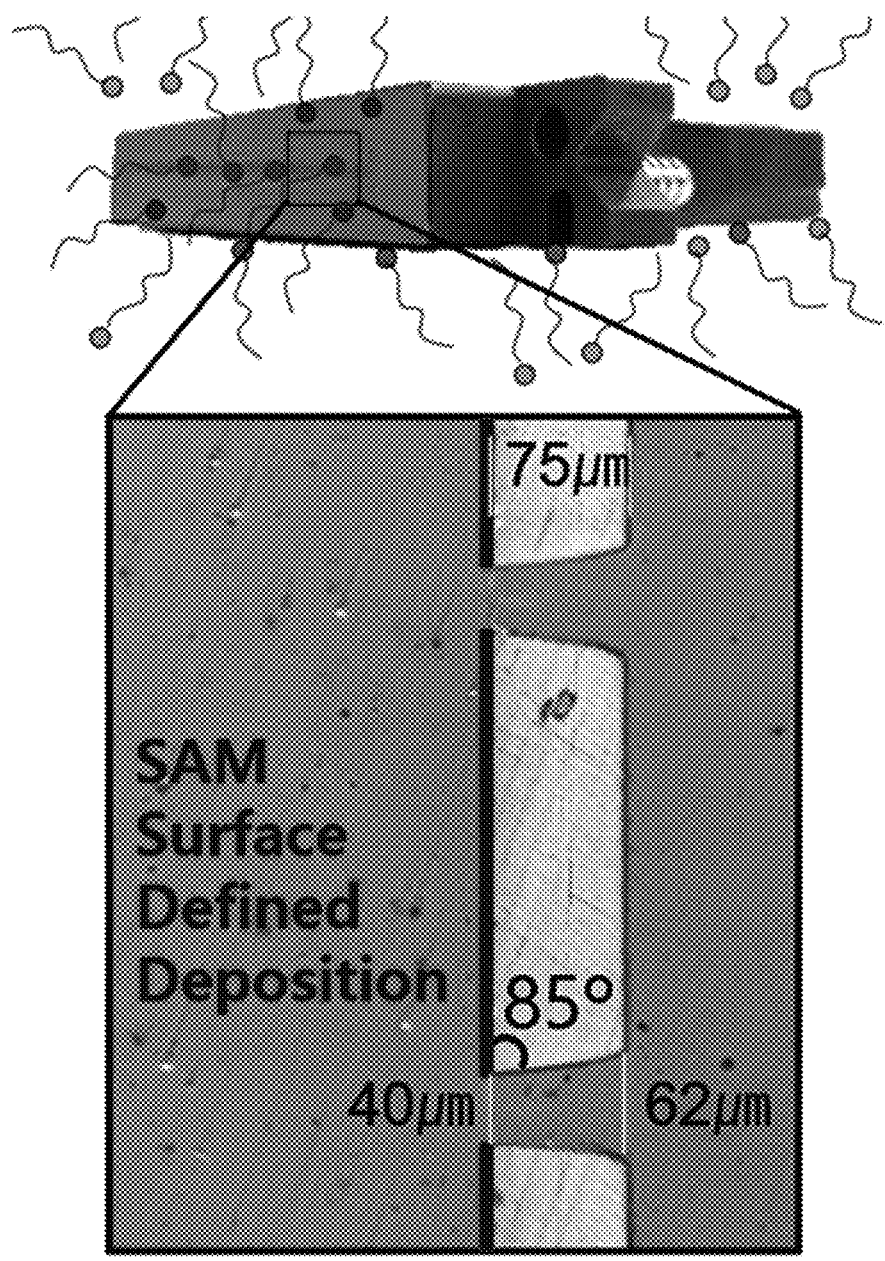
FIG. 7 illustrates a cross-section of a nozzle plate after deposition.

FIG. 5 and FIG. 6 schematically illustrate a deposition apparatus and a deposition method according to an embodiment. FIG. 7 illustrates a cross-section of a nozzle plate after deposition.

Referring to FIG. 5 and FIG. 6, the deposition apparatus 10 according to an embodiment for forming the SAM on the surface of the nozzle plate 121 includes a chamber 11 and a deposition source 12, a rotating plate 13, or the like.

The chamber 11 may be a vacuum chamber, and the deposition source 12 and the rotating plate 13 may be disposed in the chamber 11.

The deposition source 12 may store a deposition material, e.g., a SAM material, and may evaporate the deposition material. The deposition source 12 may be disposed at a lower portion of the chamber 11. The deposition source 12 may be disposed at a bottom of the chamber 11 to be movable in the first direction D1 and the second direction D2. The deposition source 12 may be referred to as a thermal boat. a single or a plurality of deposition sources 12 may be provided.

The rotating plate 13 may be disposed at an upper portion of the chamber 11. The rotating plate 13 may be rotatably coupled to a ceiling of the chamber 11. The rotating plate 13 may rotate counterclockwise or clockwise about a vertical axis extending in the third direction D3. The rotating plate 13 may also be provided to move up and down in the third direction D3. The deposition apparatus 10 may include a first driving unit 14 such as an electric motor for rotating the rotating plate 13. The first driving unit 14 may be disposed at an upper portion of the chamber 11. The first driving unit 14 may be coupled to the ceiling of the chamber 11. The first driving unit 14 may also move the rotating plate 13 up and down.

In an embodiment, the inkjet head 100 may be fixed to the rotating plate 13 to deposit the SAM on the surface of the nozzle plate 121. A surface of the rotating plate 13 to which the inkjet head 100 is fixed may be inclined at a predetermined angle θ (e.g., about 15°) with respect to a horizontal plane, or a plane defined by the first direction D1 and the second direction D2. The entire inkjet head 100 may be disposed within the chamber 11 without separating the nozzle portion 120 or the nozzle plate 121 from the inkjet head 100. The inkjet head 100 may be disposed in a way such that a longitudinal direction of the nozzle plate 121 is perpendicular to the third direction D3.

In an embodiment, a portion of the inkjet head 100 excluding the nozzle plate 121 may be sealed. In an embodiment, for example, in the inkjet head 100, the surface of the nozzle plate 121 and the nozzles 122 may be exposed, and the ink inlet 111, the ink outlet 112, the input/output terminal portion 113, or the like, through which fluid can flow in and out, may be sealed. The inkjet head 100 may be disposed in a way such that the surface of the nozzle plate 121 is substantially vertical, and thus, a direction of the nozzles 122 defined or formed through the nozzle plate 121 may be substantially horizontal. In an embodiment, for example, the surface of the nozzle plate 121 may be parallel to the third direction D3, or may be inclined at an angle within about 10°, within about 7°, within about 5°, within about 3°, or within about 1° with respect to the third direction D3. During deposition, the inkjet head 100 may rotate counterclockwise or clockwise while maintaining the surface of the nozzle plate 121 to be substantially vertical. As the inkjet head 100 rotates, the nozzle plate 121 may also rotate. When the inkjet head 100 rotates, the surface of the nozzle plate 121 may be disposed to face outward with respect to a center of the rotating plate 13.

A SAM material evaporated in the deposition source 12 may be a high molecular weight organic material. In an embodiment, for example, the SAM material may have a molecular weight in a range of about 1,000 to about 10,000, in a range about 3,000 to about 8,000, or in a range about 4,000 to about 6,000. The evaporated SAM material may travel straight within a mean free path. The mean free path may increase as a degree of vacuum in the chamber 11 increases and may decrease as a molecular weight of the material increases. Upon evaporation of high molecular weight SAM material in the high vacuum chamber 11, when the mean free path does not reach the inkjet head 100 (i.e., the mean free path being lower than a height of the nozzle plate 121 to be deposited), the SAM material may appear as vaporized molecular behavior around the nozzle plate 121. In this case, when the nozzle plate 121 of the inkjet head 100 is disposed over the deposition source 12 and rotated, the liquid repellent layer 210 is formed by colliding with and being adsorbed on the surface of the rotating nozzle plate 121 by vaporized molecules rather than directly incident molecules through the mean free path. When parts other than the nozzle plate 121 are sealed in the inkjet head 100, air flow through the nozzles 122 into the nozzle plate 121 may be suppressed due to a difference in pressure (degree of vacuum) between an inside and an outside of the nozzle plate 121. Accordingly, a number of molecules diffused or rebounded to be penetrated into the nozzle plate 121 may be reduced, the SAM material may be deposited substantially only on the surface of the nozzle plate 121, and the SAM material may not be deposited inside the nozzle plate 121 including inner surfaces of the nozzles 122 (see FIG. 7).

The distance d between the deposition source 12 and the nozzle plate 121 in the third direction D3 may be greater than the mean free path of the evaporated SAM material, e.g., about 50 cm or greater. In an embodiment, to be substantially deposited only on the surface of the nozzle plate 121 without being deposited inside the nozzles 122, the distance d between the deposition source 12 and the nozzle plate 121 may be 1 m±8 cm (i.e., in a range of 92 cm to 108 cm), and an angle at which the surface of the nozzle plate 121 is inclined with respect to the third direction D3 may be ±10° (i.e., in a range of −10° to +10°). If the distance d between the deposition source 12 and the nozzle plate 121 is smaller than 92 cm, the SAM material may be deposited into the nozzles 122, and if the distance d is greater than 108 cm, deposition efficiency may decrease. If an angle of inclination of a surface of the nozzle plate 121 with respect to the third direction D3 is out of ±10° (i.e., outside the range of −10° to +10°), the SAM material may be deposited into the nozzles 122. According to the an experimental example, when the distance d between the deposition source 12 and the nozzle plate 121 is about 1 m and the surface of the nozzle plate 121 is inclined within about 6° with respect to the third direction D3, it can be seen that the SAM material did not penetrate into the nozzle plate 121 (see FIG. 7).

In a state where the nozzle plate 121 is disposed above the deposition source 12, the nozzle plate 121 may be aligned with the deposition source 12 in the third direction D3. In an embodiment, for example, the surface of the nozzle plate 121 and the center of the deposition source 12 may be aligned in the third direction D3 (e.g., disposed on a substantially straight line). Even when the nozzle plate 121 is not aligned with the deposition source 12, the SAM material may be deposited on the surface of the nozzle plate 121, but since it will be disposed in an area with a lower molecular density than the aligned position, a deposition time may increase. On the other hand, in a position where the nozzle plate 121 and the deposition source 12 are not aligned with each other, the surface of the nozzle plate 121 is unlikely to meet molecules traveling straight from the deposition source 12, so the SAM material may not penetrate into the inner surfaces of the nozzles 122.

In an embodiment, a plurality of deposition sources 12 may be provided. In an embodiment, for example, two deposition sources 12 may be disposed in the chamber 11, the two deposition sources 12 may be disposed aligned with the nozzle plate 121 in the third direction D3, and a distance g between the two deposition sources 12 may be equal to or less than a length of the nozzle plate 121. If the distance g between the two deposition sources 12 is greater than the length of the nozzle plate 121, the deposition source 12 and the nozzle plate 121 may not be vertically aligned, and thus a possibility that the deposition material is deposited on the inner surfaces of the nozzles 122 may increase.

In an embodiment, for deposition efficiency, a plurality of inkjet heads 100 may be fixed to the rotating plate 13, and the SAM material may be deposited on surfaces of a plurality of nozzle plates 121. In an embodiment, for example, as illustrated in FIG. 6, four inkjet heads 100 may be radially fixed to the rotating plate 13 at intervals of about 90 degrees with respect to the center of the rotating plate 13. As the rotating plate 13 rotates, the surface of the nozzle plate 121 of each inkjet head 100 aligned with the deposition source 12 may be deposited with the SAM material. A number of inkjet heads 100 that can be fixed at one time may vary according to the size of the rotating plate 13 and/or the inkjet heads 100.

Figure 8:
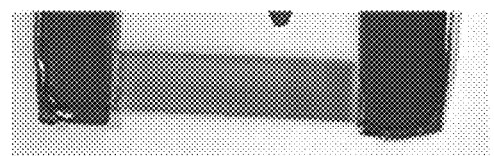
FIG. 8 illustrates a deposition result according to an incident direction.

FIG. 8 illustrates a deposition result according to an incident direction.

Referring to FIG. 8, as a nozzle simulation structure of an inkjet head, a plurality of glass plates were bonded at intervals of 130 μm using a Kapton tape, and three surfaces were sealed. A SAM material was deposited on a prepared sample in the same manner as in the above-described example, and penetration of the SAM material into the glass plate was checked by a Dyne pen test. In FIG. 8, a first stage is a sample in which a pair of glass plates are bonded together, a second stage is a sample in which two pairs of glass plates are bonded in two stages, and a third stage is a sample in which three pairs of glass plates are bonded in three stages. As a result of a dye pen evaluation, it was confirmed that there was no penetration into the inside of the glass plates. This indicates that the SAM material may be limitedly deposited only on the surface of the nozzle plate 121 during deposition, as described above.

Figure 9:
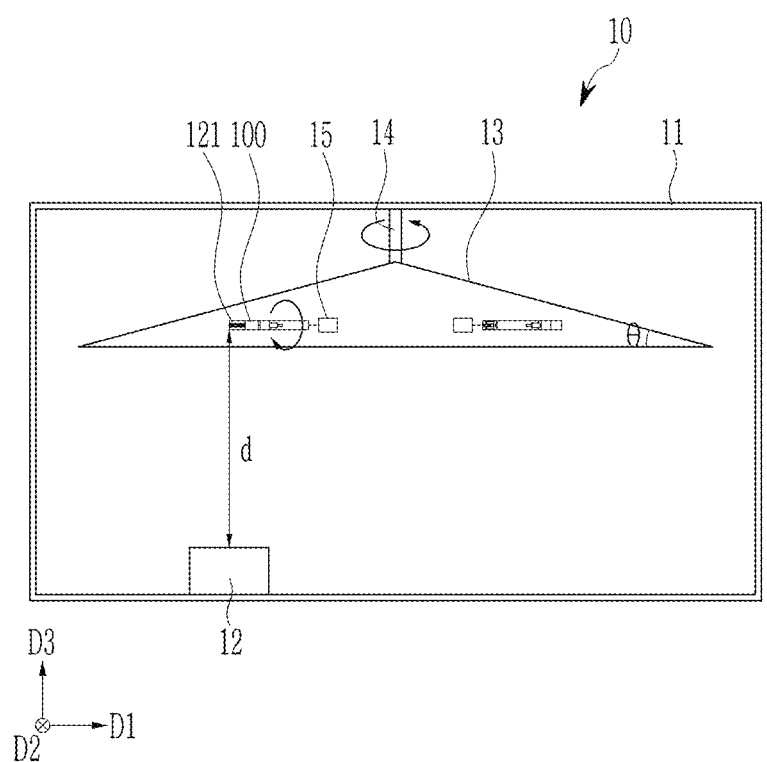
FIG. 9 and FIG. 10 schematically illustrate a deposition apparatus and a deposition method according to an embodiment.
Figure 10:
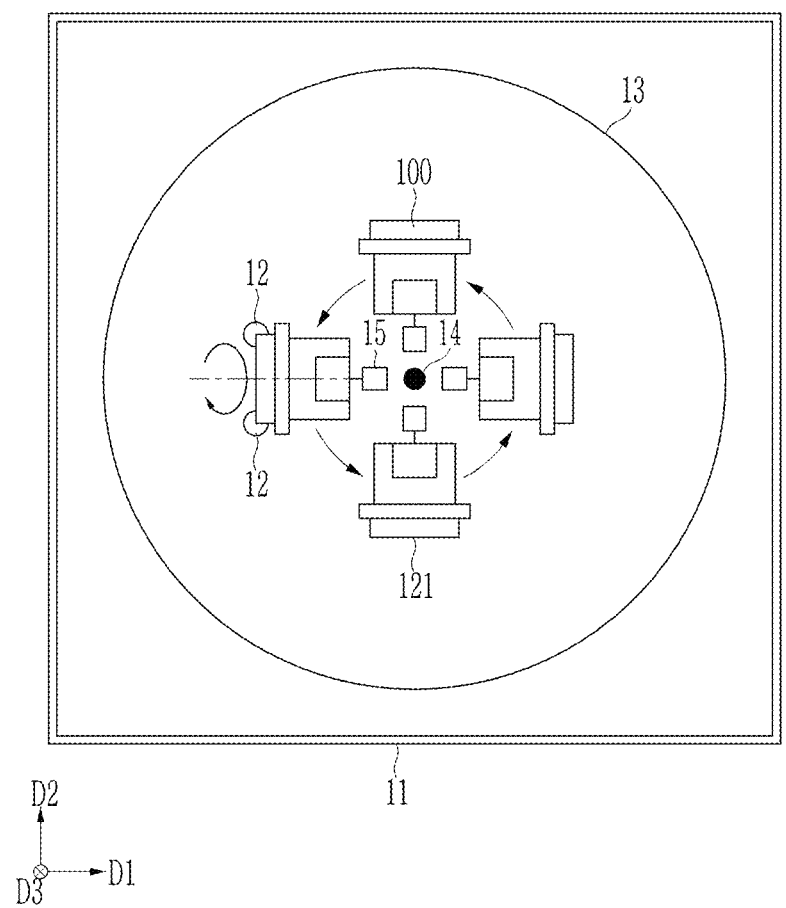

FIG. 9 and FIG. 10 schematically illustrate a deposition apparatus and a deposition method according to an embodiment.

In a deposition process, a uniform film quality may not be obtained when an excessive amount of SAM is deposited. For example, when it is difficult to access the surface of the nozzle plate 121, which is a deposition target, due to alignment of spacers, film formation may stop and the SAM material (molecules) may diffuse. This may deteriorate functionality of the deposited film and result in deposition of the SAM material on undesirable surfaces. According to an experimental example, even when a portion of the inkjet head 100 except for the nozzle plate 121 is sealed and deposited while rotating the rotating plate 13 as in the embodiments described above, when deposited with an excessive amount of SAM material, it was found to be partially deposited on surfaces of the nozzles 122 as well as on inner surfaces of the nozzles 122 (in particular, a surface facing the deposition source 12). This may be because upward molecular surface diffusion and slip easily occur. As such, since the inner surfaces of the nozzles 122 partially have liquid repellency during deposition, it may be difficult to control ink ejection.

Referring to FIG. 9 and FIG. 10, in an embodiment, when depositing the SAM material, the inkjet head 100 itself may be rotated or inverted together with rotating the rotating plate 13. That is, the inkjet head 100 may be rotated or reversed about a horizontal axis perpendicular to the third direction D3. In such an embodiment, the deposition apparatus 10 may include a second driving unit 15 such as an electric motor to rotate or reverse the inkjet head 100. The second driving unit 15 may be fixed to the rotating plate 13 to rotate together with the rotating plate 13. The inkjet head 100 may be fixed to the rotating plate 13 through the second driving unit 15. In such an embodiment, the amount of the SAM material penetrating into the nozzles 122 during deposition may be reduced, and the SAM material may be substantially limitedly deposited on the surface of the nozzle plate 121. Accordingly, a liquid repellent layer, which is a functional coating layer, may be formed only on the surface of the nozzle plate 121 without forming a functional film on the inner surfaces of the nozzles 122.

The rotation of the inkjet head 100 about the horizontal axis may be performed independently of the rotation of the rotating plate 13. In an embodiment, for example, the SAM material may be deposited while rotating the inkjet head 100 about a horizontal axis in a state in which the nozzle plate 121 is aligned with the deposition source 12 in the third direction D3.

Figure 11:
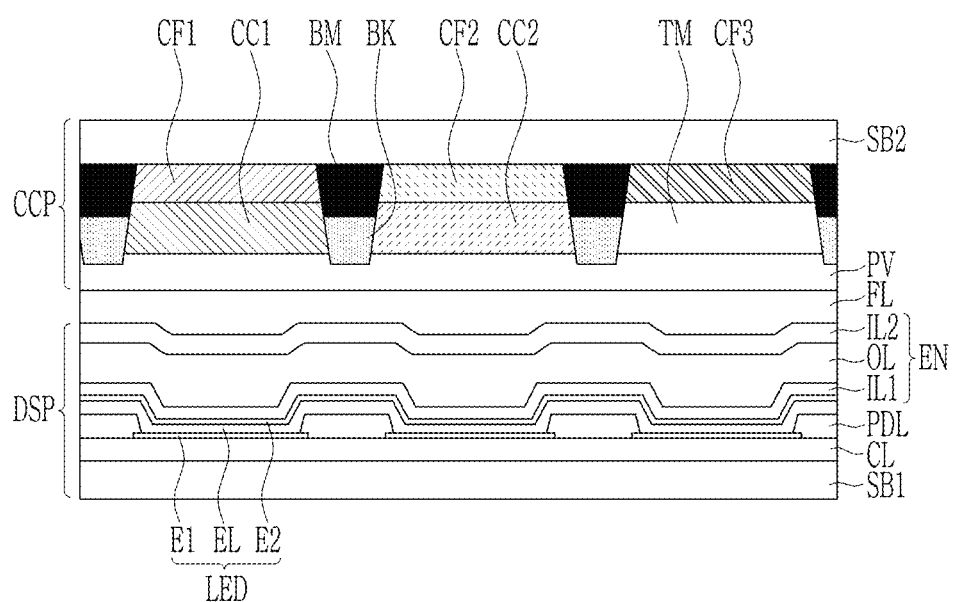
FIG. 11 illustrates a schematic cross-sectional view showing a display device according to an embodiment.

FIG. 11 illustrates a schematic cross-sectional view showing a display device according to an embodiment.

Referring to FIG. 11, the display device according to an embodiment may include a display unit DSP and a color conversion unit CCP disposed on or to face the display unit DSP. The display unit DSP and the color conversion unit CCP may be bonded together, or the color conversion unit CCP may be stacked on the display unit DSP. A filling layer FL including a filling material may be disposed between the display unit DSP and the color conversion unit CCP.

The display unit DSP may include a substrate SB1 and layers and elements disposed on the substrate SB1. The substrate SB1 may include an insulating material such as glass or plastic.

A circuit layer CL may be disposed on the substrate SB1. The circuit layer CL may include elements, such as transistors, capacitors, wires, or the like, for driving pixels of the display device. In addition, the circuit layer CL may include insulating layers for constituting elements or insulating between elements. The elements may include a conductive layer that may include a metal such as aluminum (Al), copper (Cu), titanium (Ti), or molybdenum (Mo), and may include a semiconductor layer that may include polycrystalline silicon, amorphous silicon, an oxide semiconductor, or the like. The insulating layers may include an inorganic insulating layer including an inorganic insulating material such as a silicon oxide, a silicon nitride, or a silicon nitride, and/or an organic insulating layer including an organic insulating material such as an imide-based polymer, an acrylic polymer, or a siloxane-based polymer.

Light emitting diodes LED may be disposed on the circuit layer CL. The light emitting diodes LED may constitute pixels of a display device. Each of the light emitting diodes LED may include a first electrode E1, an emission layer EL, and a second electrode E2. Although three light emitting diodes LED are illustrated in FIG. 11 for convenience of illustration, the display device may include light emitting diodes LED matching a resolution.

The first electrode E1 may be electrically connected to a transistor included in the circuit layer CL. The first electrode E1 may include a metal such as silver (Ag), lithium (Li), calcium (Ca), aluminum (Al), magnesium (Mg), or gold (Au). The pixel conductive layer may include a transparent conductive oxide (TCO) such as an indium tin oxide (ITO) or an indium zinc oxide (IZO).

A pixel defining layer PDL may be disposed on the first electrode E1. The pixel defining layer PDL may be provided with an opening defined therethrough to overlap the first electrode E1. The pixel defining layer PDL may include an organic insulating material.

The emission layer EL may be disposed on the first electrode E1 and the pixel defining layer PDL. The emission layer EL may contact the first electrode E1 through an opening defined in the pixel defining layer PDL. The emission layer EL may include a light emitting material emitting blue light. The emission layer EL may include a light emitting material that emits red light or green light in addition to blue light.

The second electrode E2 may be disposed on the emission layer EL. The second electrode E2 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), or lithium (Li). The second electrode E2 may include a transparent conductive oxide (TCO) such as an indium tin oxide (ITO) or an indium zinc oxide (IZO).

The first electrode E1 may be individually provided for each pixel to receive a driving current. The second electrode E2 may be provided in common to the pixels to receive a common voltage. The first electrode E1 may be called a pixel electrode, and the second electrode E2 may be called a common electrode. The first electrode E1 may be an anode of a light emitting diode LED, and the second electrode E2 may be a cathode of a light emitting diode LED.

An encapsulation layer EN may be disposed on the second electrode E2. The encapsulation layer EN may be a thin film encapsulation layer including inorganic insulating layers IL1 and IL2 and an organic insulating layer OL.

A filling layer FL may be disposed on the encapsulation layer EN, and a color conversion unit CCP may be disposed on the filling layer FL.

The color conversion unit CCP may include a substrate SB2. The substrate SB2 may include an insulating material such as glass or plastic.

A light blocking member BM and color filter layers CF1, CF2, and CF3 may be disposed on the substrate SB2. The light blocking member BM may overlap the pixel defining layer PDL of the display unit DSP. The light blocking member BM may be disposed so as to not overlap an opening of the pixel defining layer PDL, which is an emission area. The light blocking member BM may be disposed between the adjacent color filter layers CF1, CF2, and CF3. The light blocking member BM may contain a black pigment or dye, and may substantially reduce or effectively prevent light reflection caused by a metal layer of the display unit DSP and the like. The color filter layers CF1, CF2, and CF3 may overlap the opening of the pixel defining layer PDL. The color filter layers CF1, CF2, and CF3 may include a red color filter layer CF1 that transmits red light, a green color filter layer CF2 that transmits green light, and a blue color filter layer CF3 that transmits blue light. The color filter layers CF1, CF2, and CF3 may be formed using the inkjet printing apparatus described above.

A partition wall BK may be disposed on the light blocking member BM. The partition wall BK may overlap the pixel defining layer PDL. The partition wall BK may partition a pixel area. The partition wall BK may include an organic insulating material. In the illustrated embodiment, the color conversion unit CCP may not include the light blocking member BM, and in this case, a light blocking area may be provided by overlapping the color filter layers CF1, CF2, and CF3. Overlapping portions of the color filter layers CF1, CF2, and CF3 with the partition wall BK may be disposed between the substrate SB2 and the partition wall BK.

Color conversion layers CC1 and CC2 and a transmission layer TM may be disposed on the color filter layers CF1 and CF2. The color conversion layers CC1 and CC2 and the transmission layer TM may be disposed within a space defined by the partition wall BK. The color conversion layers CC1 and CC2 may include a red color conversion layer CC1 and a green color conversion layer CC2. The red color conversion layer CC1 may overlap the red color filter layer CF1, the green color conversion layer CC2 may overlap the green color filter layer CF2, and the transmission layer TM may overlap the blue color filter layer CF3. The color conversion layers CC1 and CC2 and the transmission layer TM may be formed using the inkjet printing apparatus described above.

The red color conversion layer CC1 and the green color conversion layer CC2 may include different semiconductor nanocrystals, respectively. In an embodiment, for example, blue light incident to the red color conversion layer CC1 may be converted into red light by semiconductor nanocrystals included in the red color conversion layer CC1 to be emitted. Blue light incident to the green color conversion layer CC2 may be converted into green light by semiconductor nanocrystals included in the green color conversion layer CC2 to be emitted.

The semiconductor nanocrystals may include phosphors and/or quantum dots that convert incident blue light into red or green light. The quantum dot may control a color of emitted light according to a particle size thereof, and thus the quantum dot may have various light emitting colors such as blue, red, and green colors.

The transmission layer TM may include a polymer material capable of transmitting blue light.

The color conversion layers CC1 and CC2 and the transmission layer TM may include scatterers. The scatterers may improve light efficiency by scattering light incident on the color conversion layers CC1 and CC2 and the transmission layer TM. The scatterers may be metal oxide particles and/or organic particles. The metal oxide may include $TiO_2$, $ZrO_2$, $Al_2O_3$, $In_2O_3$, ZnO, $SnO_2$, or the like, for example. The organic particles may include an acrylic resin, a urethane resin, or the like, for example. The scatterer may scatter light in a random direction regardless of an incident direction of the incident light.

A passivation layer PV may be disposed on the color conversion layers CC1 and CC2 and the transmission layer TM. The passivation layer PV may include an inorganic insulating material or an organic insulating material.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A deposition apparatus comprising:
a chamber;
a deposition source disposed in the chamber;
a rotating plate disposed in the chamber, wherein an inkjet head is fixed to the rotating plate to allow a nozzle plate of the inkjet head to be vertically aligned with the deposition source; and
a first driving unit disposed in the chamber, wherein the first driving unit rotates the rotating plate about a vertical axis.

2. The deposition apparatus of claim 1, further comprising a second driving unit which rotates the inkjet head about a horizontal axis.

3. The deposition apparatus of claim 2, wherein the second driving unit is fixed to the rotating plate.

4. The deposition apparatus of claim 1, wherein
a distance between the nozzle plate and the deposition source in a vertical direction is 1 m±8 cm, and
an inclined angle of the nozzle plate with respect to the vertical direction is ±10°.

5. The deposition apparatus of claim 1, wherein
a distance between the nozzle plate and the deposition source in a vertical direction is greater than a mean free path of a deposition material evaporated from the deposition source.

6. The deposition apparatus of claim 5, wherein
the deposition material is a self-assembled monolayer material having a molecular weight in a range of 1,000 to 10,000.

7. The deposition apparatus of claim 1, wherein
the deposition source is provided in plural, and
a distance between two adjacent deposition sources in a horizontal direction is less than or equal to a length of the nozzle plate.

8. The deposition apparatus of claim 1, wherein
the inkjet head is fixed to the rotating plate in a state where a portion thereof except for the nozzle plate is sealed.

9. The deposition apparatus of claim 1, wherein
a plurality of inkjet heads are radially fixed with respect to a center of the rotating plate.

* * * * *